United States Patent
Kanno et al.

(10) Patent No.: US 9,594,627 B2
(45) Date of Patent: Mar. 14, 2017

(54) CONTROLLER AND CONTROL METHOD

(71) Applicant: Kabushiki Kaisha Toshiba, Minato-ku (JP)

(72) Inventors: Shinichi Kanno, Tokyo (JP); Hironori Uchikawa, Fujisawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 49 days.

(21) Appl. No.: 14/833,246

(22) Filed: Aug. 24, 2015

(65) Prior Publication Data
US 2016/0350177 A1    Dec. 1, 2016

(30) Foreign Application Priority Data
May 25, 2015   (JP) .................. 2015-105487

(51) Int. Cl.
G11C 29/00 (2006.01)
G06F 11/10 (2006.01)
G06F 12/02 (2006.01)

(52) U.S. Cl.
CPC ...... *G06F 11/1008* (2013.01); *G06F 12/0238* (2013.01); *G06F 2212/202* (2013.01)

(58) Field of Classification Search
CPC .................. G06F 11/1008; G06F 12/023
See application file for complete search history.

(56) References Cited

U.S. PATENT DOCUMENTS

| | | |
|---|---|---|
| 8,117,517 B2 | 2/2012 | Kanno et al. |
| 8,479,080 B1 | 7/2013 | Shalvi et al. |
| 8,560,918 B1 | 10/2013 | Yang |
| 8,799,559 B2 | 8/2014 | Sharon et al. |
| 2009/0097311 A1* | 4/2009 | Roohparvar ........ G11C 11/5628 365/185.03 |
| 2013/0103891 A1* | 4/2013 | Sharon ................ G06F 12/0246 711/103 |

FOREIGN PATENT DOCUMENTS

JP    2010-238363    10/2010

* cited by examiner

*Primary Examiner* — Sam Rizk
(74) *Attorney, Agent, or Firm* — Oblon, McClelland, Maier & Neustadt, L.L.P.

(57) ABSTRACT

According to one embodiment, a controller controls a non-volatile memory stores data page by page. The controller is configured to extract, from a first data sequence shorter than the data length of a page, a second data sequence shorter than the first data sequence, to refer to the difference between threshold voltages corresponding to two data included in the second data sequence, to convert the second data sequence into a third data sequence longer than the second data sequence, and to control the percentage of the length of an error correction code added to the third data sequence.

20 Claims, 14 Drawing Sheets

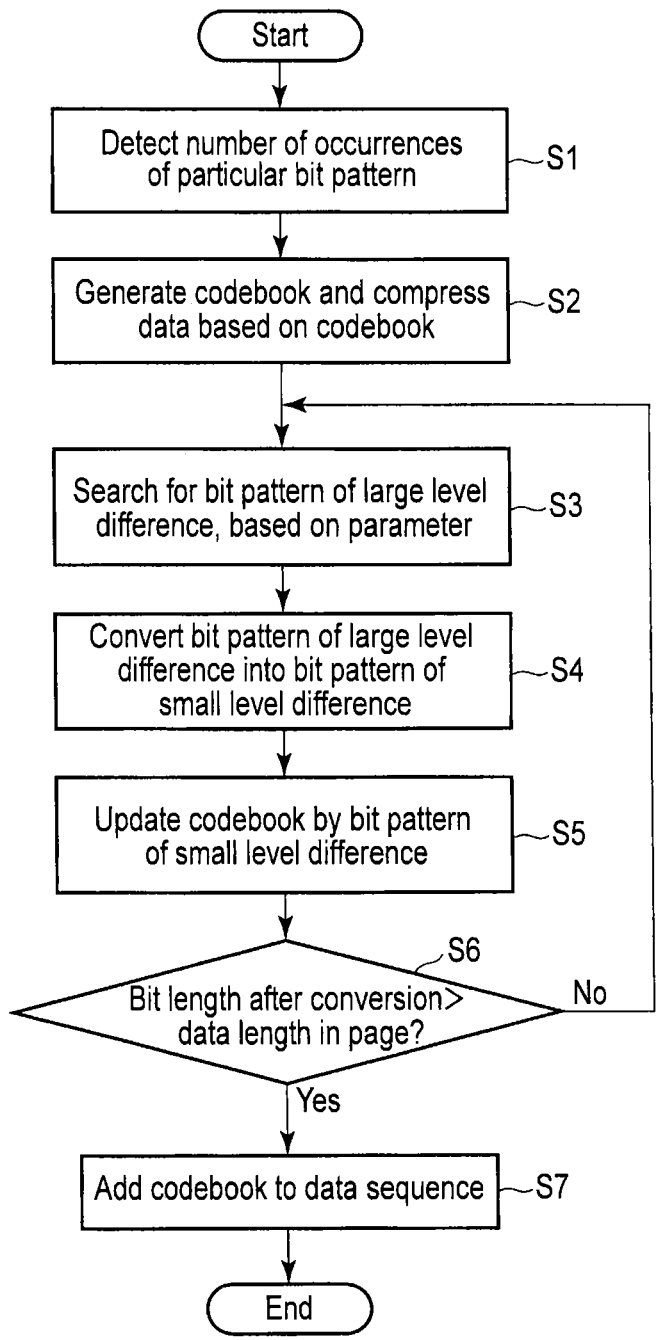
F I G. 8

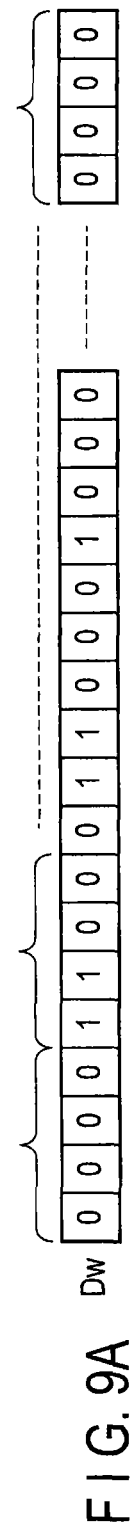
F I G. 9A
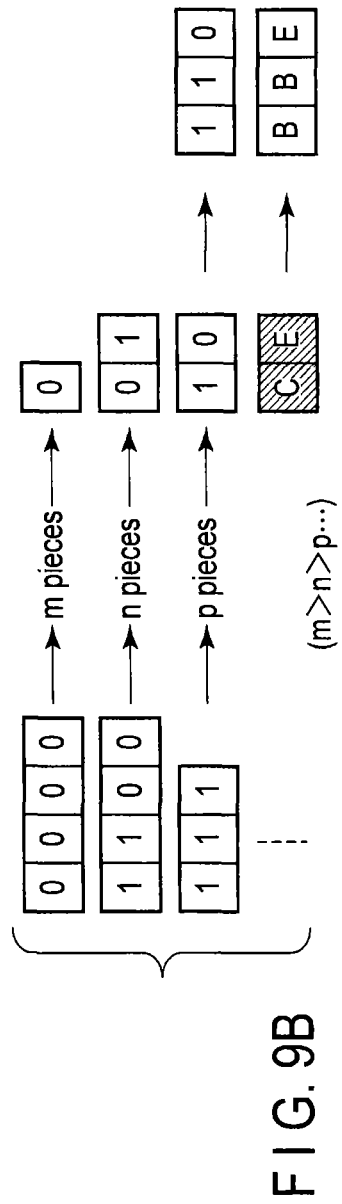
F I G. 9B
| Bit pattern | Number of occurrences | Positions of occurrences | Conversion code |
|---|---|---|---|
| --- | --- | --- | --- |
| Bit pattern | Number of occurrences | Positions of occurrences | Conversion code |
11c
F I G. 9C

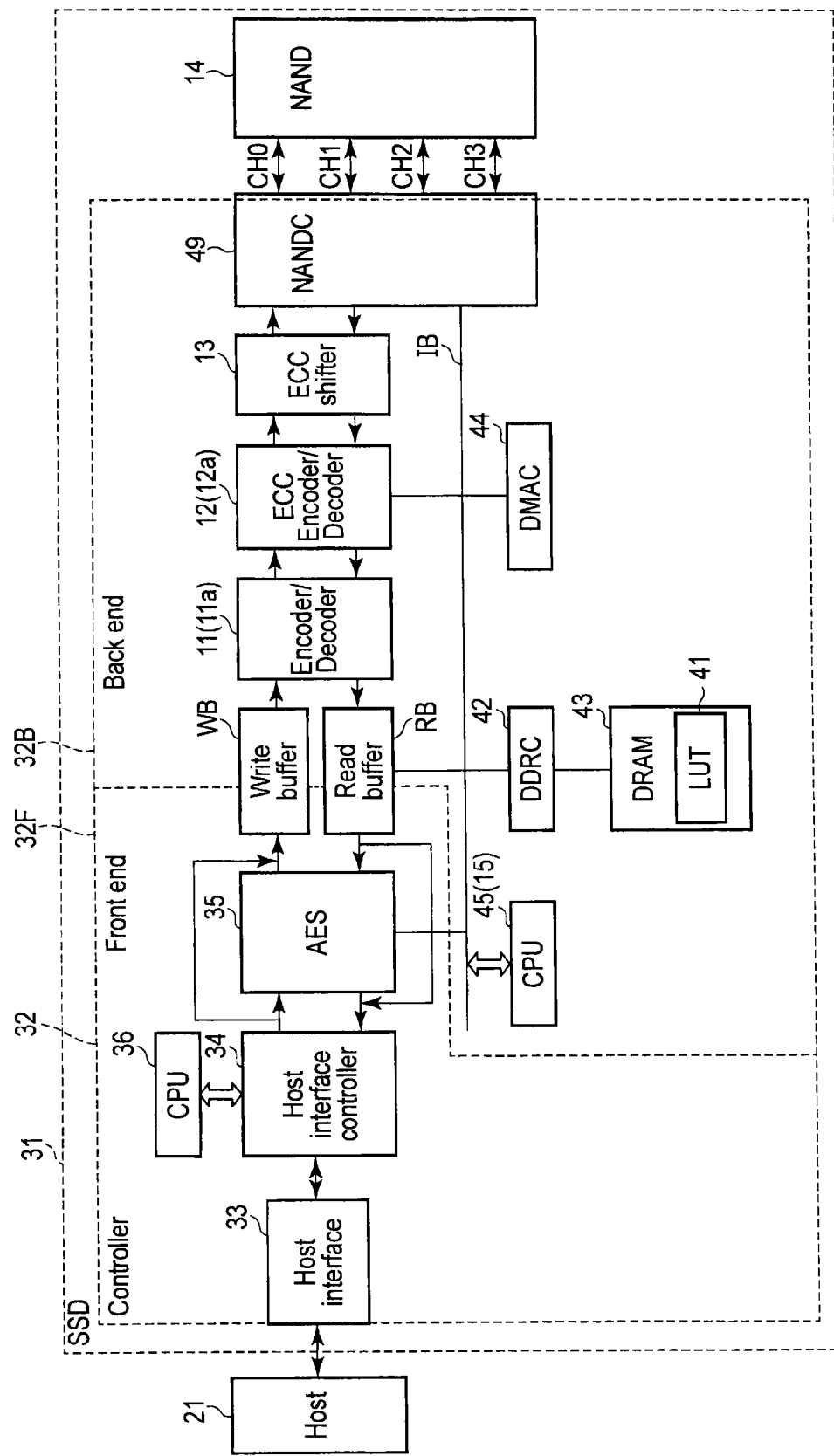
F I G. 14

Controller 10 (second embodiment)

Third table Tc (second embodiment)

| Write count | ECC | Codebook |
|---|---|---|
| 1 | ECC1 | 11c1 |
| 2 | | |
| 3 | | |
| ⋮ | | |
| 1000(NP1) | | |
| 1001 | ECC2 | 11c2 |
| 1002 | | |
| 1003 | | |
| ⋮ | | |
| 10000(NP2) | | |
| 10001 | ECC3 | 11c3 |
| 10002 | | |
| 10003 | | |
| ⋮ | | |
| 100000 | | |

(Percentage of ECC: ECC1<ECC2<ECC3
Percentage of Codebook: 11c1>11c2>11c3)

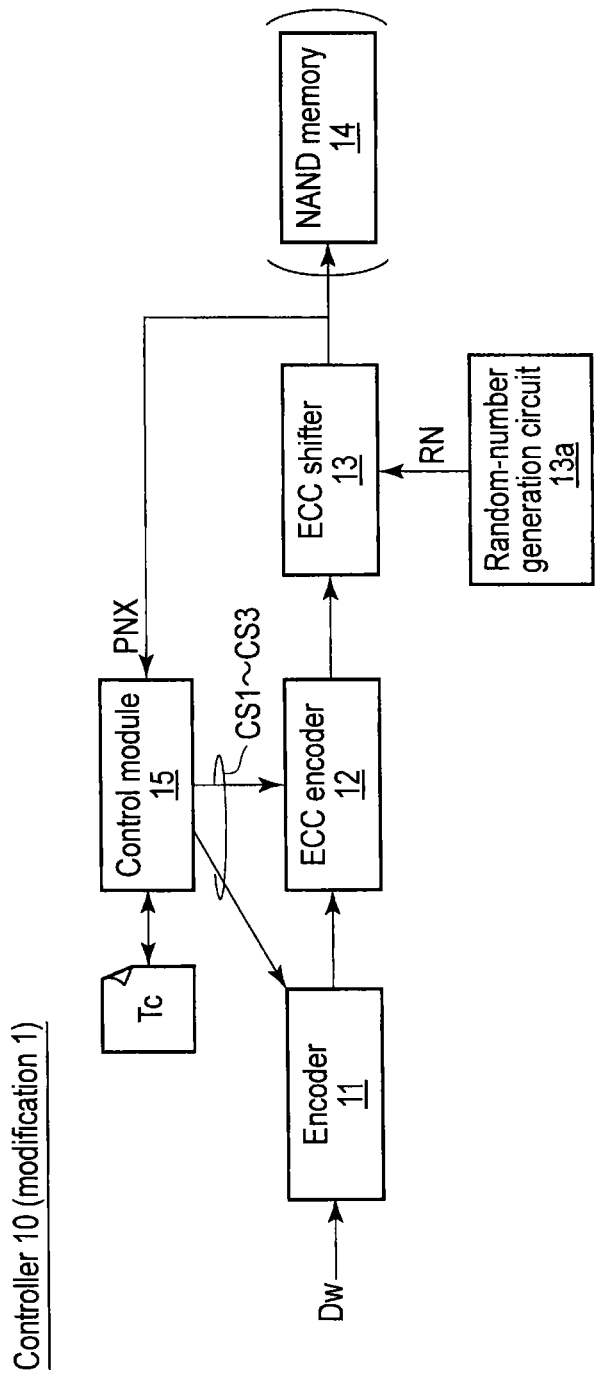
F I G. 21

CONTROLLER AND CONTROL METHOD

CROSS-REFERENCE TO RELATED APPLICATIONS

This application is based upon and claims the benefit of priority from Japanese Patent Application No. 2015-105487, filed May 25, 2015, the entire contents of which are incorporated herein by reference.

FIELD

Embodiments described herein relate generally to a controller and a control method.

BACKGROUND

A NAND flash memory as a nonvolatile semiconductor memory can store, for example, multilevel data, using a plurality of threshold voltages for each memory cell. If a high threshold voltage is repeatedly applied to a memory cell, the tunnel oxide film of the memory cell is degraded, thereby shortening the life of the cell. Further, if there are great differences in threshold voltage between a plurality of memory cells arranged adjacent to each other along a word or bit line, the memory cells having a low threshold voltage vary in threshold voltage, which may cause, for example, program disturbance.

BRIEF DESCRIPTION OF THE DRAWINGS

FIG. 8 is a flowchart showing the operation of the encoder.

FIG. 9A is a view showing an example of input data.

FIG. 9B is a view showing operations of the encoder.

FIG. 9C is a view showing an example of a codebook.

FIG. 14 is a block diagram showing an example of an SSD to which the controller of the first embodiment is applied.

FIG. 21 is a schematic block diagram of a controller according to modification 1, showing a data write system.

DETAILED DESCRIPTION

Figure 1:
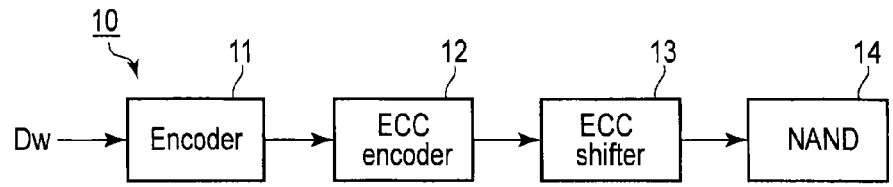
FIG. 1 is a schematic block diagram of an example of a controller according to a first embodiment, showing a data write system.

In general, according to one embodiment, a controller controls a nonvolatile memory stores data page by page. The controller is configured to extract, from a first data sequence shorter than the data length of a page, a second data sequence shorter than the first data sequence, to refer to the difference between threshold voltages corresponding to two data included in the second data sequence, to convert the second data sequence into a third data sequence longer than the second data sequence, and to control the percentage of the length of an error correction code added to the third data sequence.

Various embodiments will be described hereinafter with reference to the accompanying drawings. In the description, a plurality of expressions are used as examples for some elements. However, the expression examples are merely examples, and hence those elements may be expressed by other expressions. Further, even elements, which are not expressed by a plurality of expressions, may be expressed by other expressions.

(First Embodiment)

Firstly, a first embodiment will be described with reference to the accompanying drawings. In the drawings, like reference numbers denote like elements.

FIG. 1 schematically shows an example of a controller 10 which controls a NAND flash memory (hereinafter, referred to simply as a NAND memory) 14 according to the first embodiment. FIG. 1 shows only a data write system. The controller 10 comprises an encoder 11, an error correction code (ECC) encoder 12, and an ECC shifter 13.

The encoder 11 performs processing of converting input write data Dw in order to enhance the durability of the NAND memory 14 and suppress program disturbance. The ECC encoder 12 adds an ECC to data supplied from the encoder 11. Although in general, the ECC refers to an error-correction coding scheme itself, redundant data to be added for error correction will be referred to as the ECC in the embodiments. The ECC shifter 13 shifts, within a page, the position of the ECC added to data, thereby performing smoothing so that ECCs are recorded in different positions on the NAND memory 14 when writing is executed a number of times.

The NAND memory 14 is, for example, a multilevel memory, in which one of a plurality of threshold voltages is stored in one memory cell, using data of two or more bits. The NAND memory 14 includes a plurality of blocks (not shown), and each of the blocks includes a plurality of pages. In the first embodiment, the block is an erase unit. The page is a write unit and includes write data and an ECC.

Figure 2:
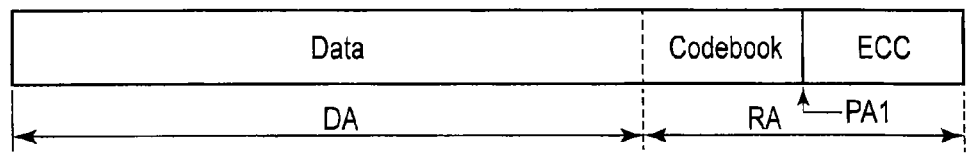
FIG. 2 is a schematic view showing an example of a page according to the first embodiment.

FIG. 2 shows an example of the page. The page shown in FIG. 2 comprises a data area DA where write data Dw, for example, and a redundant area RA where is located a codebook and ECC. The length of the entire page and the length of data (data length or bit length) in the page are constant. However, as will be described later, the data length of the page and the data length of an ECC area can be also made variable by managing the data length of the page and the data length of the ECC area. The page structure shown in FIG. 2 is just an example. For instance, the codebook may be included in the data area DA. Further, a header area, for example, where a command, for example, is provided, may be provided at the top of the page.

Figure 3:
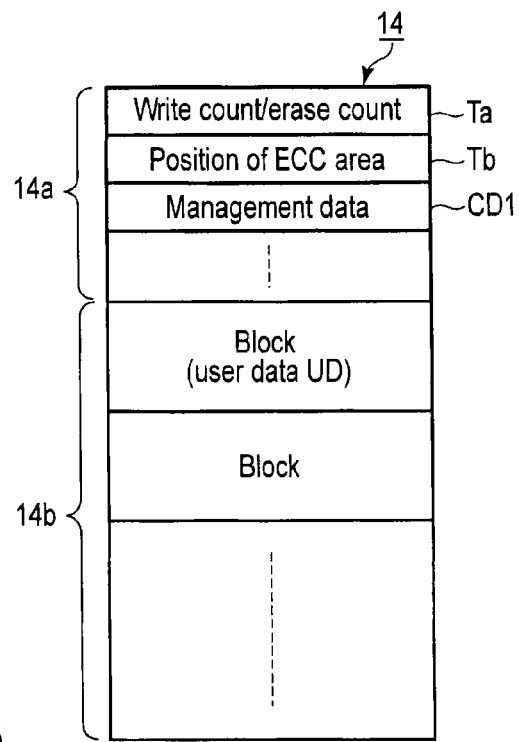
FIG. 3 is a schematic view showing an example of a NAND flash memory according to the first embodiment.

FIG. 3 schematically shows an example of the structure of the NAND memory 14. As shown in FIG. 3, the NAND memory 14 has a management area 14a and a data area 14b.

The management area 14a and data area 14b each have a plurality of blocks as erase units. The management area 14a stores various management data CD1 for the NAND memory 14. The data area 14b stores user data UD, such as music data.

The management area 14a comprises, for example, a first table Ta and a second table Tb. The first table Ta is used to manage the number of writes and the number of erases block by block. The first table Ta is updated whenever a write or erase is executed in each block. The second table Tb is used to manage the position of the ECC area in each page block by block, for example, as will be described later.

Figure 4:
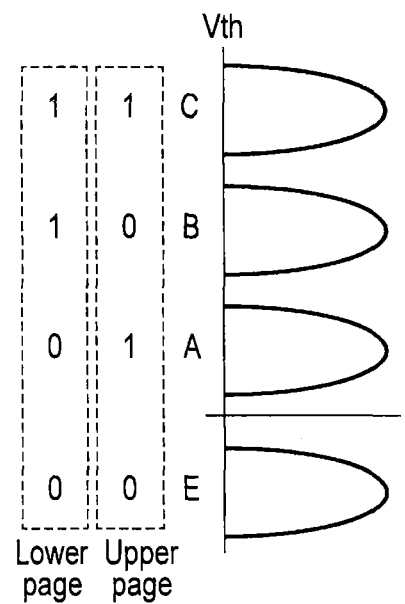
FIG. 4 is a view showing an example of a threshold voltage for the NAND flash memory.

FIG. 4 shows the relationship between write data and a threshold voltage set in each memory cell of the NAND memory 14. As shown in FIG. 4, the NAND memory 14 can store multilevel data, using, for example, a plurality of threshold voltages. Specifically, FIG. 4 shows a threshold voltage distribution of 2-bit and 4-level threshold voltages, for example. When 2-bit data is stored in a memory cell, threshold voltages having distributions of E, A, B and C are set, using data of upper and lower pages.

Hereafter, the threshold voltage distributions of E, A, B and C will be also referred to levels E, A, B and C, respectively. Level E indicates an erase level, and threshold voltage Vth is set higher in order of E, A, B and C. Namely, the level relationship therebetween is E<A<B<C. It is sufficient if the "level differences (the differences between the threshold voltage distributions)" exist such that at least the difference between any ones of the levels (threshold voltage distributions) can be detected by, for example, a sense amplifier. Namely, cases associated with the level (range) differences can include a case where the levels are not completely separate from each other (for example, a certain level range may overlap with another level range). In addition, "levels" are not always limited to fixed ones corresponding to respective stages. In the specification, it is sufficient if "levels" can discriminate respective threshold voltages. The "levels" can include other signals, such as a continuous voltage detected by, for example, a sense amplifier.

If, for example, level C, which is highest among the four levels, is frequently written to a memory cell, the gate insulating film of the memory cell is degraded to thereby reduce the life of the same. To avoid this, it is necessary to reduce the number of level-C writes to the memory cell.

Figure 5:
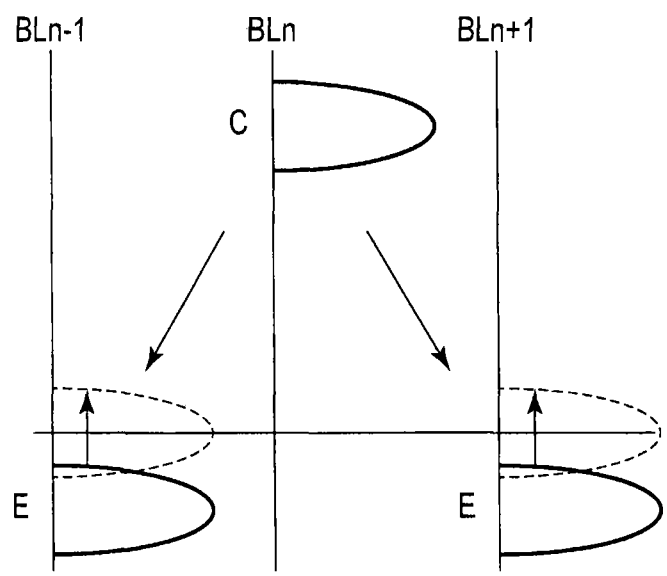
FIG. 5 is a view showing an example of program disturbance in the NAND flash memory.

Further, in the NAND memory 14, data is simultaneously written to a plurality of memory cells arranged adjacently along a row (along, for example, a word line, not shown). If the levels of data written to a plurality of memory cells arranged adjacently along a row are, for example, E, C and E, there is a significant difference between level E and level C as shown in FIG. 5. When data of level C having a great level difference to level E is written, the threshold voltage of level E varies and an error will occur.

This phenomenon will occur also when data of a great level difference is written to a plurality of memory cells arranged along a column (along, for example, a bit line, not shown). Thus, when there is a great level difference between a plurality of memory cells arranged adjacently along the row or column, the lower level (threshold voltage) is raised, with the result that program disturbance occurs.

In order to suppress the program disturbance, it is necessary to reduce the level differences between a plurality of adjacent memory cells. To this end, it is also necessary to suppress level-C writes of a high threshold voltage.

[Encoder]

Figure 6:
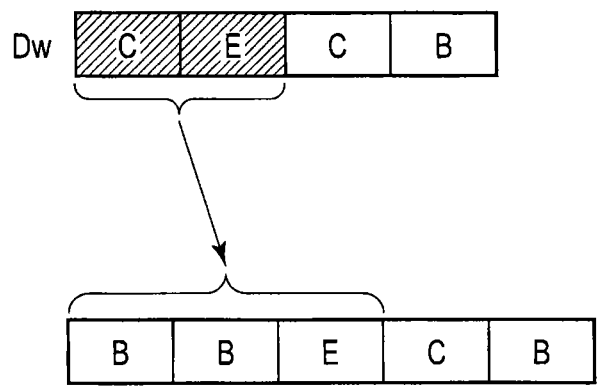
FIG. 6 is a schematic view showing an operation of an encoder shown in FIG. 1.

FIG. 6 schematically shows the operation of the encoder 11 shown in FIG. 1.

In FIG. 6, Dw denotes an example of a data sequence including a plurality of data written to a plurality of memory cells arranged adjacently along, for example, a row. The data sequence Dw indicates data written to each memory cell as a level set in each memory cell.

As shown in FIG. 6, if a pattern of levels set in a memory cell by the data sequence Dw is, for example, C, E, C and B, the encoder 11 shown in FIG. 1 searches for a pattern of, for example, levels C and E having a significant difference (threshold voltage difference) from data Dw. If a level pattern of C and E is found, the encoder 11 converts the level pattern of C and E into a level pattern that has a smaller level difference than the level pattern of C and E, and does not occur in the data sequence Dw. In other words, the encoder 11 replaces a code that exhibits a significant interference between adjacent cells with a code that exhibits a small interference, by decompressing the first-mentioned code. The code is a code for expressing data using a set of bits 0 and/or 1 constituting the data. A level pattern occurring in the data sequence Dw can be used as the code. It is sufficient if a replaced code can be discriminated from other codes.

In the example shown in FIG. 6, the level pattern of C and E is replaced with, for example, a level pattern of B, B and E. The encoder 11 repeats such search and conversion processing as the above within the page.

The level pattern of B, B and E after conversion has a data length (bit length) longer than the original level pattern of C and E. The encoder 11 repeats the above search and conversion processing, and stops the processing when the data length after conversion is determined to exceed a data length predetermined in the page. As a result, the data length after conversion does not exceed the predetermined data length in the page. That is, the conversion process is performed within the predetermined data length in the page. If the level pattern of C and E is left in the remaining data in the page after the conversion processing is stopped, it is left unchanged even after the conversion. Thus, the embodiment allows slight degradation of the durability of the memory cell, and slight program disturbance.

The above-described search and conversion processing can be also executed on a data pattern written to a plurality of memory cells arranged along a column. In this case, it is sufficient if a buffer capable of holding data corresponding to, for example, one block is provided, and the above-mentioned search is made along the column on the data held by the buffer, thereby executing conversion processing based on the search result.

Figure 7:
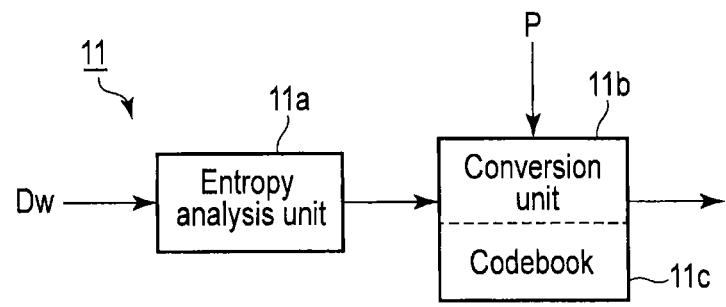
FIG. 7 is a schematic block diagram showing an example of the encoder.

FIG. 7 shows an example of the encoder 11. As shown in FIG. 7, the encoder 11 comprises an entropy analysis unit 11a and a conversion unit 11b.

The entropy analysis unit 11a acquires the probability or the number of occurrences of each particular bit pattern included in the bit sequence of data Dw input, for example, page by page. Further, the entropy analysis unit 11*a* arranges, for example, the acquired numbers of occurrences of the bit patterns in a decreasing order.

The conversion unit 11*b* generates a codebook 11*c* including conversion codes for compressing each bit pattern, based on the analysis result of the entropy analysis unit 11*a*.

Further, the conversion unit 11*b* converts the analyzed particular bit patterns into codes in accordance with the conversion codes of the codebook 11*c*. Furthermore, the conversion unit 11*b* receives a parameter P set beforehand, for example. The parameter P is used to improve, for example, the durability and characteristics of the NAND memory 14, and is, for example, a code indicating a bit pattern of a great level difference. The conversion unit 11*b* searches the codes converted in accordance with the above-mentioned conversion codes, for a code indicated by the parameter P. When the code indicated by the parameter P is found, it is converted into another code corresponding to a bit pattern of a small level difference. This conversion processing is, for example, extension processing for decompressing codes, as will be described later.

Moreover, the conversion unit 11*b* updates the codebook 11*c* by replacing a code of a great level difference with another code of a small level difference. The updated codebook 11*c* is added to, for example, the end of a data sequence.

FIGS. 8, 9A, 9B and 9C show an operation example of the encoder 11. Referring to FIGS. 8, 9A, 9B and 9C, a further description will be given of the operation of the encoder 11.

The entropy analysis unit 11*a* acquires the number of occurrences of each particular bit pattern included in the data sequence Dw input, for example, page by page (S1). The number of occurrences refers to the number of occurrences of each particular bit pattern included in the data sequence Dw.

Specifically, when there is the data sequence Dw as shown in FIG. 9A, the number of occurrences of each particular bit pattern, such as 0000, 1100 or 111, included in the data sequence Dw is counted. The counted numbers of occurrences are arranged in a decreasing order.

Namely, as shown in FIG. 9B, the numbers of occurrences are counted such that the number of occurrences of 0000 is m, the number of occurrences of 1100 is n, and the number of occurrences of 111 is p (m>n>p). The numbers of occurrences m, n and p are arranged in the decreasing order. Thus, each bit pattern that does not occur in the data sequence Dw is detected by searching for particular bit patterns.

If data stored in a memory cell is expressed using two bits and four levels, it comprises two pages as aforementioned. For this reason, a buffer memory corresponding to, for example, two pages is prepared. From a data sequence corresponding to the two pages in the buffer memory, the number of occurrences of each particular bit pattern is counted, and the resultant numbers of occurrences are arranged in the decreasing order.

Regarding data expressed using three bits and eight levels or more, a buffer memory of three pages or more is prepared, and the above-mentioned processing is performed on a data sequence of three pages or more.

The conversion unit 11*b* generates the codebook 11*c* including conversion data, such as conversion codes for compressing the bit length of each page, based on the analysis result of the entropy analysis unit 11*a*, and executes compression processing of the input data sequence Dw, based on the codebook 11*c* (S2).

FIG. 9C shows an example of the codebook 11*c*. For instance, the codebook 11*c* includes, as conversion data, the number of occurrences of each particular bit pattern obtained by the entropy analysis unit 11*a*, the occurrence position of each particular bit pattern, and/or a conversion code generated in accordance with each particular bit pattern. The structure of the codebook 11*c* is not limited to this, but deformable.

The conversion unit 11*b* compresses the data sequence Dw, based on the conversion codes of the codebook 11*c*. More specifically, as shown in FIG. 9B, a bit pattern of 0000, the number of occurrences of which is largest, is converted into a code of, for example, 0, based on the conversion codes. Similarly, a bit pattern of 1100, the number of occurrences of which is next largest, is converted into a code of, for example, 01, and a bit pattern of 111, the number of occurrences of which is next largest, is converted into a code of, for example, 10. Thus, the bit pattern 0000 is compressed from 4 (=4 bits)×m to 1/4 m, the bit pattern 1100 is compressed from 4 (=4 bits)×n to 1/2 n, and the bit pattern 111 is compressed from 3 (=3 bits)×p to 2/3 p.

Further, the conversion unit 11*b* detects, based on the parameter P, whether the converted codes include a code corresponding to a level pattern of a greatest level difference (S3). If the code corresponding to the level pattern of the greatest level difference is detected, it is converted into a code of a smaller level difference (S4).

More specifically, if the parameter P indicates the code of 10 corresponding to, for example, a level pattern of C and E that has a greatest level difference, as shown in FIG. 9B, the code of 10 is searched for in the converted codes. If the code of 10 is detected, it is converted into a code, such as 110, corresponding to a level pattern of, for example, B, B and E, which has a smaller level difference than the level pattern of C and E. This code of 110 is a code that does not occur in the data sequence Dw analyzed in the entropy analysis unit 11*a*. Thus, the level pattern of C and E having the greatest level difference in threshold voltage is converted into the level pattern of B, B and E, which has a smaller level difference. The level pattern of B, B and E is further decompressed than the level pattern of C and E.

The code of 10 as a conversion code in the codebook 11*c* is updated to the code of 110 corresponding to the level pattern of B, B and E having a smaller level difference (S5).

Although in principle, the data sequence Dw before conversion is compressed by the above-mentioned conversion processing, the bit length of a level pattern having a greatest level difference in threshold voltage is longer after the conversion than before the conversion.

The conversion unit 11*b* repeats the above-mentioned search and conversion processing on the data sequence Dw (S6 to S3). If the bit length of the converted data exceeds, for example, a bit length preset for data in a page, the conversion unit 11*b* stops the conversion processing. In other words, the conversion processing is executed within the preset data length in a page.

Subsequently, the generated codebook 11*c* is added to, for example, the end of the data sequence in the page (S7).

If data stored in a memory cell is expressed using two bits and four levels, the conversion unit 11*b* generates data corresponding to, for example, two pages by the above-mentioned conversion operation. If data stored in a memory cell is expressed using three bits and eight levels or more, the conversion unit 11*b* generates data corresponding to, for example, three pages or more.

Although in the first embodiment, one the parameter P is supplied to the conversion unit 11*b*, a plurality of the parameters may be set. Namely, in the above embodiment, as the parameter P, the code of 10 corresponding to the level pattern of C and E that has the greatest level difference is searched for. However, in addition to this parameter, a code corresponding to a level pattern of C and A or B and E may be set as another parameter, be searched for, and be converted into another code of a small level difference.

[ECC Encoder]

The ECC encoder 12 shown in FIG. 1 adds an error correction code (ECC) as data for error correction to a data sequence including the codebook 11$c$ supplied from the encoder 11, using for example, a systematic code. The systematic code includes a Hamming code, a BHC code, a Reed Solomon code, etc. The embodiment employs the Reed Solomon code in which a minimum unit for error correction comprises a plurality of bits. However, the systematic code is not limited to the Reed Solomon code. In the systematic code, a data sequence is separate from an ECC. Therefore, the content of the data sequence including the codebook 11$c$ is unchanged, which enables the state of the above-mentioned compressed or decompressed data sequence and the content of the codebook 11$c$ to be maintained.

[ECC Shifter]

An ECC added to a data sequence by the ECC encoder 12 using the systematic code is not subjected to the above-mentioned conversion processing. Accordingly, the ECC may include data of level C, and the occurrence probability of the level-C data may be high. Because of this, if an area (hereinafter referred to as an ECC area) of a page where the ECC is added is fixed in position in the page, the level-C data is frequently written to a memory cell in the ECC area. Accordingly, it is strongly possible that the memory cells in the ECC area will be further degraded than memory cells to which data is written.

The ECC shifter 13 shown in FIG. 1 shifts the position of the ECC area in the page, based on, for example, the number of accesses to a block, more specifically, the number of, for example, writes and/or erases to/from the block.

As shown in FIG. 3, the number of writes or erases to or from each block of the NAND memory 14 is managed by the first table Ta. The ECC shifter 13 changes the position of the ECC area in the page when, for example, the number of writes to a target block exceeds a reference value.

Figure 10:
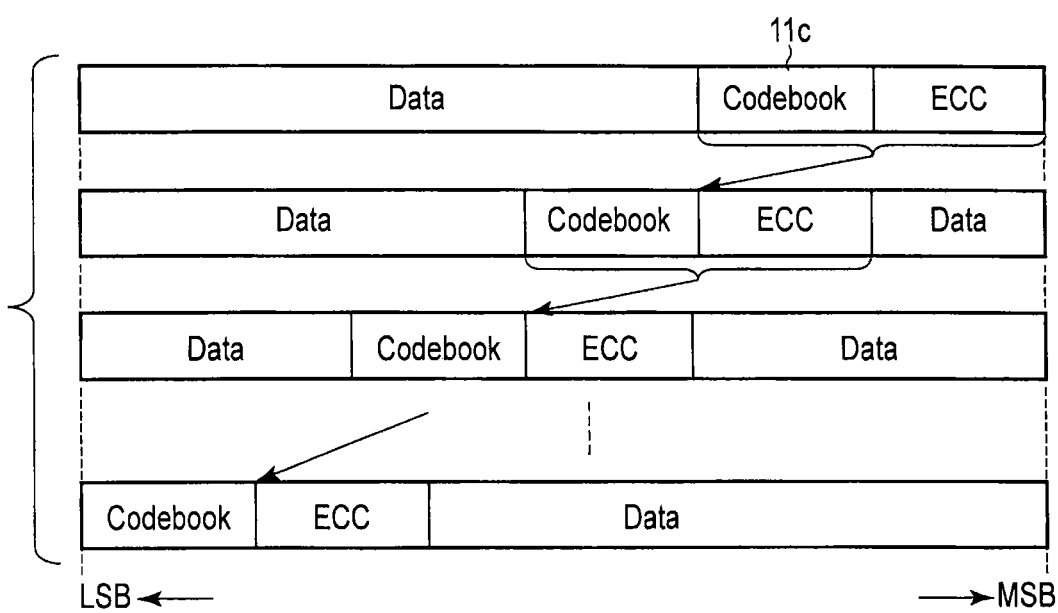
FIG. 10 is a schematic view showing an operation of an ECC shifter shown in FIG. 1.

That is, the ECC area is provided near, for example, the most significant bit (MSB) in the page at first, as is shown in FIG. 10. Whenever the number of writes to a block as a write target exceeds the reference value, the position of the ECC area in the page is shifted, for example, from the MSB toward a least significant bit (LSB).

Specifically, the ECC shifter 13 comprises, for example, a shift register, and data in the shift register is rotated from the MSB toward the LSB, based on the number of writes to the block. Namely, data output from the LSB side in accordance with the shift operation is input to the MSB side. Thus, the position of the ECC area in the page is changed. The shift direction and position of the ECC area are not limited to the above. It is sufficient if the position of the ECC area in the page is changed.

Figure 11:
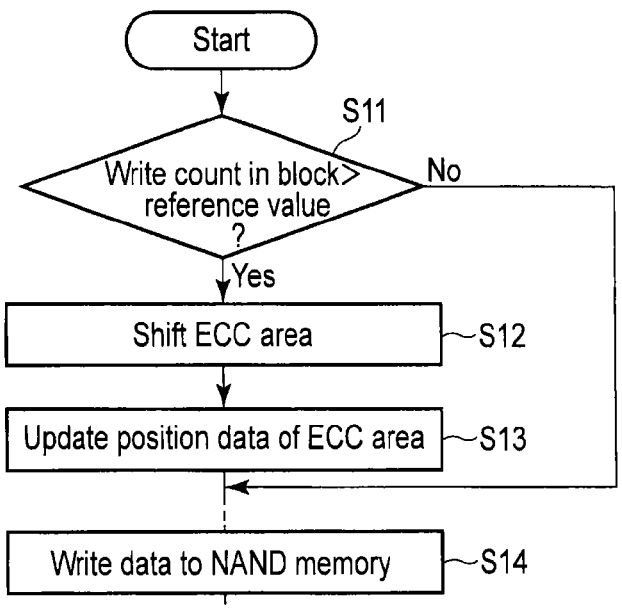
FIG. 11 is a flowchart showing the operation of the ECC shifter.

FIG. 11 shows an operation example of the ECC shifter 13. During writing, the ECC shifter 13 compares, with the reference value, the number of writes to a write target block recorded in the first table Ta (S11). If the comparison result indicates that the number of writes exceeds the reference value, the ECC area is shifted within the page (S12). Subsequently, the second table Tb of the NAND memory 14 is updated by new ECC-area position data (S13). That is, the position data in the second table Tb on the ECC area corresponding to the write target block is updated. In contrast, if the number of writes does not exceed the reference value, the ECC area is not shifted. Thereafter, the data having its ECC area position in the page adjusted is written to the NAND memory 14 (S14).

By thus shifting the ECC area position within the page whenever the number of writes to a block exceeds the reference value, degradation of the memory cells in the ECC area can be prevented, thereby increasing the life of the memory cells.

FIG. 10 shows a case where the codebook 11$c$ in the page is shifted along with the ECC area. Since as described above, the codebook 11$c$ includes a conversion code for converting the level pattern of C and E into the level pattern of B, B and E, it includes the level-C data. Therefore, if an area (hereinafter, referred to a codebook area) to which the codebook 11$c$ is added is repeatedly written to the same position in the page, the memory cells will be degraded as in the case of the ECC area. Namely, if the codebook area is shifted along with the ECC area as shown in FIG. 10, degradation of the memory cells can be prevented.

In addition, since the codebook area is shifted along with the ECC area, the position of the codebook in the page can be relatively determined from the position of the ECC area.

Moreover, in the above description, the position of the ECC area is shifted in accordance with the number of writes to each block stored in the management area of the NAND memory 14. However, the embodiment is not limited to this. The same advantage can be obtained even when, for example, the positions of the ECC area and the codebook area are changed based on the number of erases from a block.

[Reading of Data]

A read operation will be described. In the read operation, processing opposite to the processing in the above-described write operation is executed.

Figure 12:
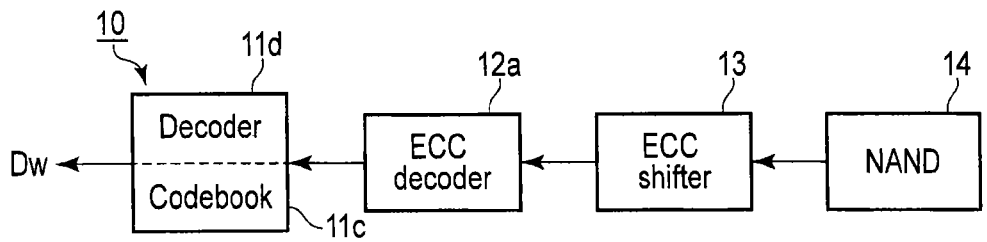
FIG. 12 is a schematic block diagram of another example of the controller according to the first embodiment, showing a data read system.
Figure 13:
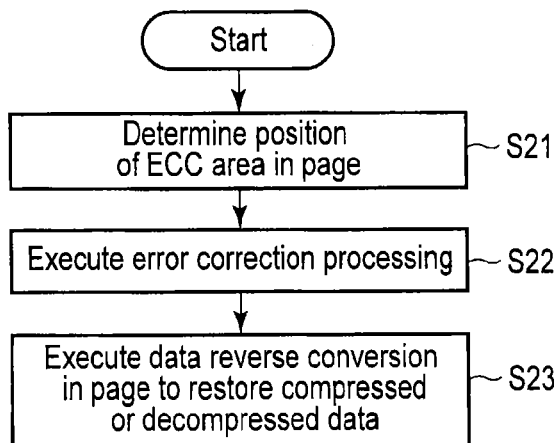
FIG. 13 is a schematic flowchart showing an operation of the controller shown in FIG. 12.

FIG. 12 schematically shows the configuration of a read system, and FIG. 13 shows the operation of the read system. Referring now to FIGS. 12 and 13, the read operation will be described.

One-page data, for example, read from the NAND memory 14 is supplied to the ECC shifter 13. The ECC shifter 13 determines the position of an ECC area in a page, based on position data of ECC areas corresponding to respective blocks recorded in the second table Tb shown in FIG. 3 (S21). The ECC shifter 13 may return the ECC area to the position shown in, for example, FIG. 2, based on the result of the determination.

An ECC decoder 12$a$ performs error correction processing when a data sequence includes an error, based on an ECC in the determined ECC area.

A decoder 11$d$ reversely converts data in a page, based on the codebook 11$c$ added to the data in the page, thereby returning compressed or decompressed data to original data to thereby reproduce write data (S23). Namely, the conversion unit 11$b$ converts the compressed or decompressed data into the original data sequence in accordance with the codebook 11$c$. As a result, the data sequence obtained by a replacement with a level pattern of a small level difference is converted into an original bit pattern of a great level difference.

Further, the data compressed based on the number of occurrences of each particular bit pattern is converted into the original bit pattern, and returned to the original position. Thus, the original data sequence is reproduced.

[Configuration of SSD]

FIG. 14 shows an example of an SSD (memory system) 31 to which the first embodiment is applied.

In the SSD 31, a controller 32 comprises a front end 32F and a back end 32B.

The front end (host communications unit) 32F comprises a host interface 33, a host interface controller 34, an encryption/decryption unit (Advanced Encryption Standard [AES] unit) 35, and a CPU 36.

The host interface 33 transmits and receives various commands, LBAs, data, etc., to and from the host 21. The commands include a write command, a read command, an erase command, etc.

The host interface controller 34 controls communication of the host interface 33 under control of the CPU 36.

In a write operation, the AES unit 35 encrypts write data supplied from the host interface controller 34, and supplies the resultant data to a write buffer WB in the back end 32B. In a read operation, the AES unit 35 decrypts encrypted read data transmitted from a read buffer RB in the back end 32B. Write and read data can be transmitted without being passed through the AES unit 35, depending on circumstances.

The CPU 36 controls the host interface 33, the host interface controller 34, and the AES unit 35 of the front end 32F, thereby controlling the operation of the whole front end 32F.

The back end 32B comprises a write buffer WB, a read buffer RB, a lookup table (LUT) 41, a double-data-rate controller (DDRC) 42, a dynamic random access memory (DRAM) 43, a direct memory access controller (DMAC) 44, a CPU 45, the aforementioned encoder 11/decoder 11a, ECC encoder 12, ECC decoder 12a and ECC shifter 13, and a NAND memory controller (NANDC) 49.

The write buffer WB temporarily stores write data transmitted from a data processing apparatus 2.

Specifically, the write buffer WB temporarily stores write data until the write data is accumulated to have a predetermined data size suitable for the NAND memory 14.

The read buffer RB temporarily stores data read from the NAND memory 14. Specifically, in the read buffer RB, read data is rearranged in an order suitable for the data processing apparatus (host) 21 (i.e., in the order of logical block addresses (LBA) specified by the data processing apparatus 21).

The LUT 41 is data for converting a logical block address (LBA) into a physical block address (PBA).

The DDRC 42 controls double data rate (DDR) in the DRAM 43.

The DRAM 43 is a nonvolatile memory that stores, for example, the LUT 41.

The DMAC 44 transmits write data, read data, etc., via an internal bus IB.

The CPU 45 controls each of the above-mentioned elements (41, 42, 11, 11a, 12, 12a, 13, 49) included in the back end 32B, and controls the whole operation of the back end 32B.

At the data writing, the encoder 11 analyzes the entropy of a data sequence supplied from the write buffer WB as described above, and encodes the data sequence, based on the codebook 11c, to reduce the level difference between data written to adjacent memory cells. The ECC encoder 12 adds, using a systematic code, an ECC to a data sequence that includes the codebook 11c supplied from the encoder 11. The ECC shifter 13 shifts the position of an ECC area in a page, and a codebook area, based on, for example, the number of writes to a write target block. Data corresponding to one page and output from the ECC shifter 13 is supplied to the NANDC 49, and is written to the NAND memory 14 by the NANDC 49.

At the data reading, data corresponding to one page and output from the NAND memory 14 is supplied to the ECC shifter 13 via the NANDC 49. The ECC shifter 13 determines the position of an ECC area in the one page, based on the position data of the ECC area stored in the second table Tb. The ECC decoder 12a performs data-error correction processing based on the determined ECC in the ECC area. The decoder 11a decodes data supplied from the ECC decoder 12a, based on the codebook 11c. The data sequence reproduced by the decoder 11a is supplied to the read buffer RB.

FIG. 14 shows only one DMAC 44. However, two or more DMACs 44 may be employed. The DMAC 44 can be installed in various positions within the controller 32, depending upon circumstances.

The NANDC 49 accesses the NAND memory 14 in a parallel manner, using a plurality of channels (in the embodiment, four channels CH0 to CH3) in order to satisfy a command for realizing a predetermined speed.

The configuration of the controller 32 shown in FIG. 14 is just an example, and the embodiment is not limited to this configuration. Moreover, the SSD 31 is applicable to different types of NAND memories, such as NAND memories of different design rules, a planar NAND memory and a stereoscopic NAND memory.

Further, the modules (the encoder 11, the ECC encoder 12, the control unit 45 (15), etc.) included in the controller 32 (10) can be replaced with a hardware configuration, such as circuits. Furthermore, the controller 32 (10) comprises not only a controller chip single body as a unit of sale, but also a main controller chip single body for controlling the NAND memory 14, and modules including peripheral circuits/components of the main controller chip. In other words, in the specification, the controller 32 (10) is not limited to a single packaged device, but may include functions or units for directly or indirectly controlling the NAND memory 14 if various elements and functions of the controller 32 (10) are localized as components.

[Advantage of First Embodiment]

According to the above-described first embodiment, a data pattern of a great threshold voltage difference included in the input data Dw is converted into a data pattern of a small threshold voltage difference. This suppresses the occurrence of program disturbance. Moreover, since in this case, data of a high threshold voltage is reduced, the durability of each memory cell is enhanced and its life can be increased.

Further, since the program disturbance is suppressed, read errors can be reduced. Accordingly, it is not necessary to use an advanced ECC, and the time required for encoding and decoding the ECC can be reduced.

Furthermore, the positions of the ECC area and the codebook area in a page are shifted in accordance with the number of writes and erases to and from a block. Accordingly, the durability of each memory cell can be enhanced, compared to a case where the positions of the ECC area and the codebook area are fixed.

(Second Embodiment)

Referring then to FIGS. 15 to 18, a second embodiment will be described. In the description below, elements similar to those of the first embodiment will not be described.

[Configuration]
[Configuration of Controller]

Figures 15, 16:
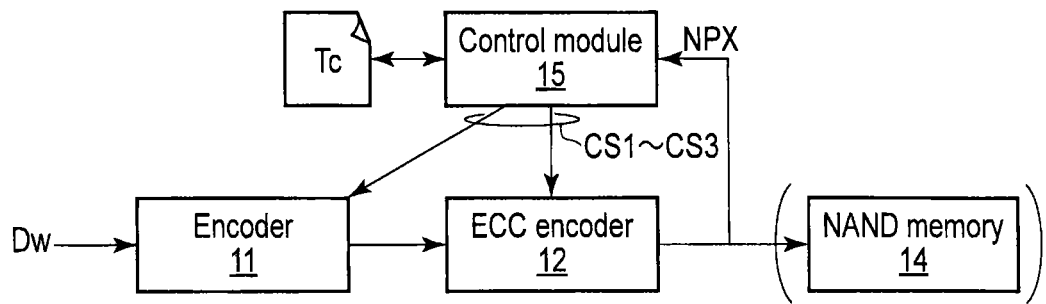
FIG. 15 is a schematic block diagram of an example of a controller according to a second embodiment, showing a write system.
FIG. 16 is a view showing an example of a third table shown in FIG. 15.

Referring first to FIG. 15, a description will be given of a controller 10 according to the second embodiment. As shown in FIG. 15, the controller 10 of the second embodiment further comprises third table Tc and a control module 15, and does not comprise an element corresponding to the ECC shifter 13, compared to the first embodiment.

Third table Tc shows at least the number of writes in a page and an error correction code (ECC) added to the page, in association with each other. Third table Tc will be described later in detail.

The control module 15 transmits a control signal CS to the encoder 11 and the ECC encoder 12, thereby controlling the ratio between the lengths of the codebook 11c and the error correction code in a page. When writing the write data Dw to a predetermined page in the NAND memory 14, the control module 15 refers to third table Tc. Further, the control module 15 receives a feedback signal indicating the number of writes to the page (write count NPX), and generates control signals CS1 to CS3 based on a result of comparison between the write count NPX and a write count read from third table Tc. Details of the operation of the control module 15 will be described later.

The control module 15 corresponds to, for example, the CPU 45 shown in FIG. 14. The write count NPX may be fed back to the control module 15 through a control line IB under the control of the NANDC 49 shown in FIG. 14. Data fed back to the control module 15 is not limited to the write count NPX. It is sufficient if the data is the number of accesses to the NAND memory 14, such as the number of reads page by page or the number of erases block by block.

With the above-described configuration, the ECC encoder (error correction module) 14 adds an error correction code (ECC) to the write data Dw including the third data sequence, based on control signals CS1 to CS3 output from the control module 15.

The write data Dw with the error correction code added is written to the NAND memory 14 page by page under the control of, for example, the NANDC 49, as in the first embodiment.

[Configuration of Third Table Tc]

Referring now to FIG. 16, the configuration of third table Tc according to the second embodiment will be described. As shown in FIG. 16, third table Tc shows the number of writes to a page, and an ECC and the codebook added to the page, in association with one another.

For instance, third table Tc shows 1 to 1000 times (NP1) as write counts in association with ECC1 and codebook 11c1. In this case, NP1 as the 1000 times indicates a first threshold for these write counts. Third table Tc further shows, for instance, 1001 to 10000 times (NP2) as write counts in associated with ECC2 and codebook 11c2. NP2 as the 10000 times indicates a second threshold for these write counts. Third table Tc yet further shows, for instance, 10001 to 100000 times (NP3) as write counts in association with ECC3 and codebook 11c3.

In third table Tc, the percentage of the length of the ECC in the redundant area RA is set higher in proportion to the write count (ECC1<ECC2<ECC3). In other words, in third table Tc, the data size of the ECC in the redundant area RA is set larger in proportion to the write count. In contrast, in third table Tc, the percentage of the length of the codebook 11c in the redundant area RA is set lower in proportion to the write count (11c1>11c2>11c3) in accordance with changes in the intensity of the ECC. For instance, the portion of the redundant area RA occupied by the codebook 11c is obtained by subtracting, from the whole redundant area RA, the portion of the redundant area RA occupied by the ECC.

The structure of third table Tc shown in FIG. 16 is just an example, and third table Tc is not limited to this structure. For example, the table may show read counts page by page or erase counts, as well as the write counts. Moreover, if, for example, the write counts are stored in a predetermined memory in the controller 10, it is not necessary to store them in the table. Also, a predetermined mathematical expression, function, etc., may be employed instead of the table.

Since the other part of the configuration is substantially the same as that of the first embodiment, it will not be described in detail.

[Operation]
[Processing of Changing the Percentage of Length of ECC]

Figure 17:
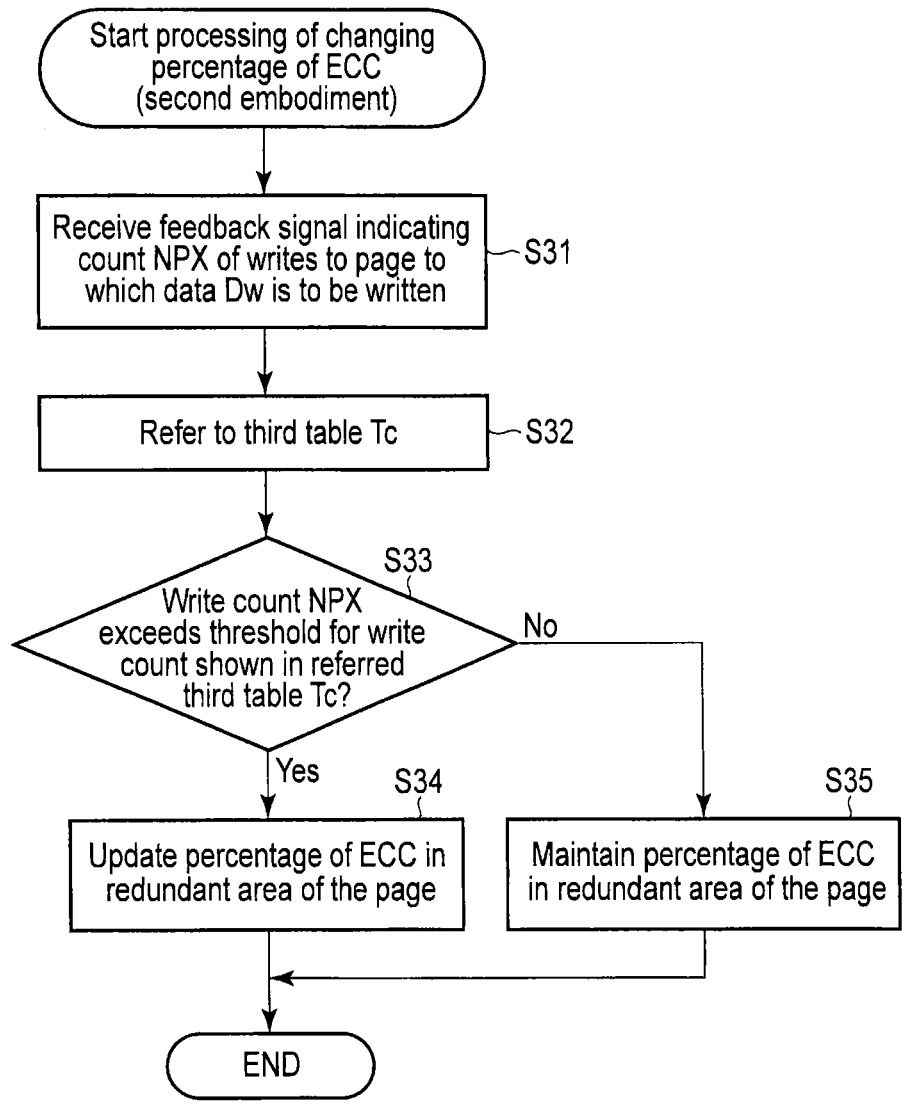
FIG. 17 is a flowchart showing processing of changing the percentage of the length of an ECC according to the second embodiment.

Referring then to FIG. 17, a description will be given of processing of changing the percentage of the length of the ECC, employed in the second embodiment in the above-described structure.

In step S31, the write count NPX of a page, to which the write data Dw is to be written, is fed back to the controller 10. Specifically, the control module 15 of the controller 10 receives, from, for example, the NANDC 49, a feedback signal indicating the write count NPX of a page with a page address, to which the write data Dw is to be written.

In step S32, the controller 10 refers to third table Tc. Specifically, the control module 15 of the controller 10 refers to third table Tc to confirm which write count in third table Tc corresponds to the fed-back write count NPX.

In step S33, the controller 10 determines whether the write count NPX exceeds the referred write-count threshold (NP1 or NP2) in third table Tc.

In step S34, if the write count NPX exceeds the referred write-count threshold in third table Tc (Yes in step S33), the controller 10 changes the percentage of the length of the ECC in the redundant area RA of the page.

For example, in step S34, if the write count NPX exceeds write-count threshold NP1 in third table Tc, the control module 15 of the controller 10 changes the ECC so as to increase the percentage of the length of the ECC added in the redundant area RA of the page, i.e., changes ECC1 to ECC2. In accordance with the change of the length of the ECC, the control module 15 changes the codebook 11c so as to reduce the percentage of the length of the codebook 11c, i.e., changes 11c1 to 11c2. In accordance with the changes in the ECC and the codebook 11c, the control module 15 changes the control signal from CS1 to CS2.

In addition, upon receiving control signal CS2, the encoder 11 adds shorter codebook 11c2 to the write data Dw in accordance with control signal CS2. Similarly, upon receiving control signal CS2, the ECC encoder 12 adds longer ECC2 to the data sequence including codebook 11c2 and the write data Dw. The data sequence including codebook 11c2, ECC2 and the write data Dw is written to a predetermined page in the NAND memory 14.

For example, in step S34, if the write count NPX exceeds write-count threshold NP2 in third table Tc, the control module 15 of the controller 10 changes the ECC added in the redundant area RA of the page so as to increase the percentage of the length of the ECC, i.e., changes ECC2 to ECC3. In accordance with the change of the length of the ECC, the control module 15 changes the codebook 11c so as to reduce the percentage of the length of the codebook 11c, i.e., changes 11c2 to 11c3. In accordance with the changes in the ECC and the codebook 11c, the control module 15 changes the control signal from CS2 to CS3.

Upon receiving control signal CS3, the encoder 11 adds shorter codebook 11c3 to the write data Dw in accordance with control signal CS3. Similarly, upon receiving control signal CS3, the ECC encoder 12 adds longer ECC3 to the data sequence including codebook 11c3 and the write data Dw, in accordance with control signal CS3. The data sequence including codebook 11c3, ECC3 and the write data Dw is written to a predetermined page in the NAND memory 14.

In step S35, if the write count NPX is not more than the referred write-count threshold in third table Tc (No in step S33), the controller 10 does not change the percentage of the length of the ECC in the redundant area RA of the page.

For example, in step S35, if the write count NPX is not more than write-count threshold NP1 in third table Tc, the control module 15 of the controller 10 does not change the ratio between the lengths of the ECC and the codebook 11c added in the redundant area RA of the page. Since in this case, the ECC and the codebook 11c are unchanged, the control module 15 does not change the control signal, i.e., transmits control signal CS1 to the encoder 11 and the ECC encoder 12.

The other operations are substantially the same as those of the first embodiment, and are therefore not described in detail.

[Advantages]

As described above, the configuration and operation according to the second embodiment provide the same advantage as that of the first embodiment, and also provide the following advantage (1) at least:

(1) Data can be protected in just proportion, and hence the life of the NAND memory 14 can be extended.

In an initial stage (for example, at the shipping of a product), data is not yet written to the memory cells of the NAND memory 14. Accordingly, error correction is hardly required, and addition of an ECC is hardly necessary. In contrast, the tunnel oxide film of each memory cell of the NAND memory 14 is degraded over time since data is repeatedly written to each memory cell. To overcome this, stronger error correction is required, and hence an error correction code ECC of a larger data size must be added.

In view of the above, the controller 10 according to the second embodiment comprises the control module 15 that controls the ratio between the lengths of the error correction code ECC and the codebook 11c added in each page (FIG. 15).

In the above-mentioned configuration, the control module 15 of the controller 10 determines whether the fed-back write count NPX exceeds a write-count threshold (NP1 or NP2) in third table Tc (S33 in FIG. 17). If the write count NPX is not more than the write-count threshold in third table Tc, the control module 15 does not change the ratio between the lengths of the ECC and the codebook 11c in redundant area RA of the page (S35 in FIG. 17).

Figure 18:
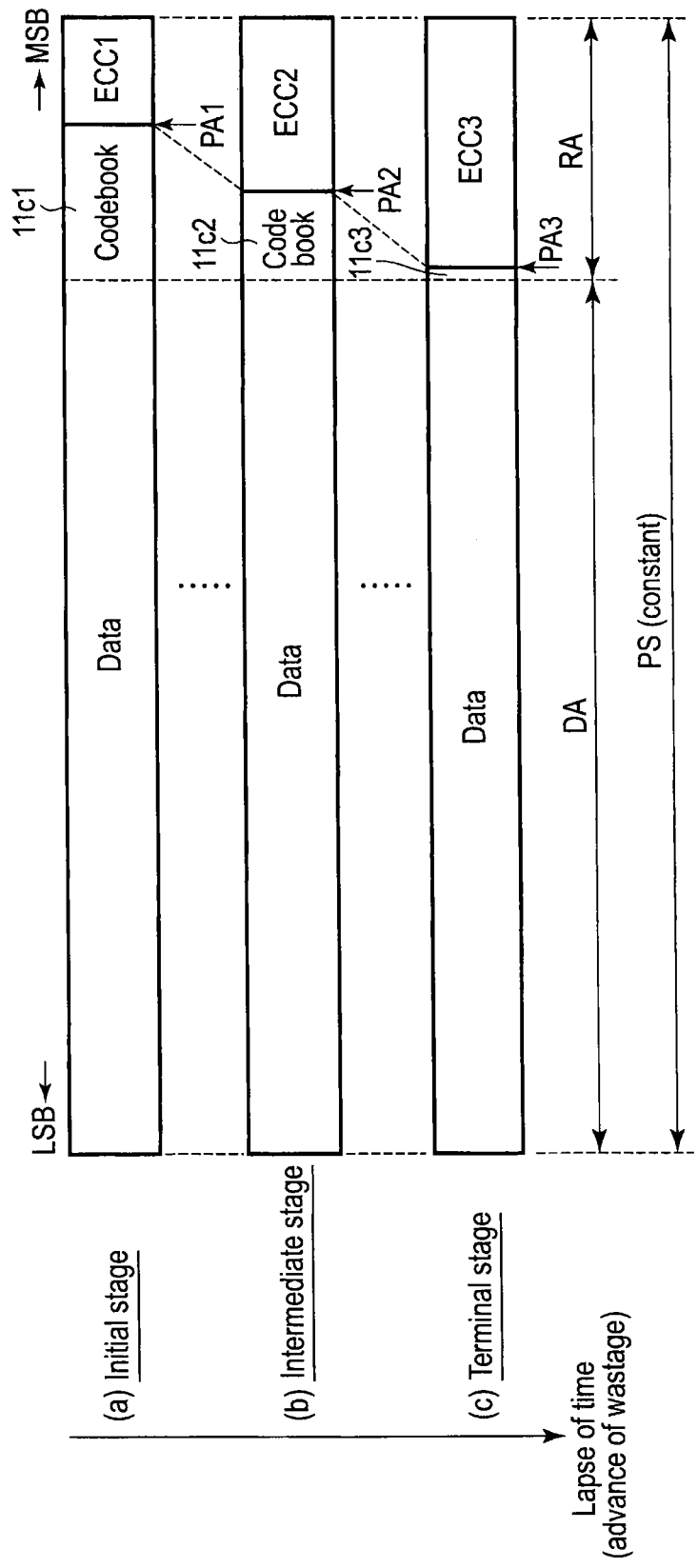
FIG. 18 is a view showing an example of a page structure according to the second embodiment.

For example, in an initial state shown in (a) of FIG. 18, no write has been made to the memory cells of the NAND memory 14. Accordingly, error correction is almost unnecessary, and hence an ECC is almost unnecessary. Therefore, if, for example, the write count NPX is not more than the write-count threshold in third table Tc, the control module 15 of the controller 10 does not change the ratio between the lengths of the ECC and the codebook 11c in redundant area RA of the page. As a result, the page in the initial state (a) is constructed so that the ratio of the length of ECC1 to that of codebook 11c1 in the redundant area RA will be small. For instance, the position of the leading portion of ECC1 in the initial state (a) is page address PA1 closest to the MSB.

Thus, in the initial state (a), wastage of data in the data area DA can be suppressed by eliminating an extra portion of ECC1 and increasing the length of codebook 11c1.

Furthermore, if the write count NPX is more than the write-count threshold in third table Tc, the control module 15 changes the ratio between the lengths of the ECC and the codebook 11c in the redundant area RA of the page (S34 in FIG. 17).

For example, in a terminal state shown in (c) of FIG. 18, since data has been repeatedly written in the memory cells of the NAND memory 14, stronger error correction is needed. Therefore, if, for example, the write count NPX exceeds write-count threshold NP2 in third table Tc, the control module 15 of the controller 10 increases the ratio of the length of the ECC to that of the codebook 11c in the redundant area RA of the page. As a result, the page in the terminal state (c) is constructed so that the ratio of the length of ECC3 to that of codebook 11c3 is increased in the redundant area RA. For example, the position of the leading portion of ECC3 in the terminal state (c) is closer to the LSB and corresponds to page address PA3. Thus, in the terminal state (c), the life of data in the data area DA can be increased by increasing the length of necessary ECC3 and decreasing the length of codebook 11c3.

As described above, in the second embodiment, the ratio between the lengths of the ECC and the codebook 11c is changed with time (in accordance with wastage of memory cells). For instance, in an initial state where few errors occur, part of the redundant area RA, which is used as the ECC, is allocated to the codebook 11c. This can sufficiently protect data and increase the life of the memory cells of the NAND memory 14.

In other words, in the second embodiment, by changing the ratio between the lengths of the ECC and the codebook 11c in accordance with advance of wastage of the NAND memory 14 and the life-stage thereof, fluctuation of data quality can be minimized between initial and terminal stages. Moreover, in the second embodiment, an initial quality, which is higher than necessary, can be maintained even in the terminal stage.

In addition, in the second embodiment, the ratio between the lengths of the ECC and the codebook 11c in the redundant area RA is changed, while the amount of data in the data area DA is kept unchanged. Therefore, the amount of data in the data area DA per 1 page PS is maintained, which enables the device to be designed easily and produced at low cost.

(Third Embodiment [An Example According to a Request from a Host])

Figure 19:
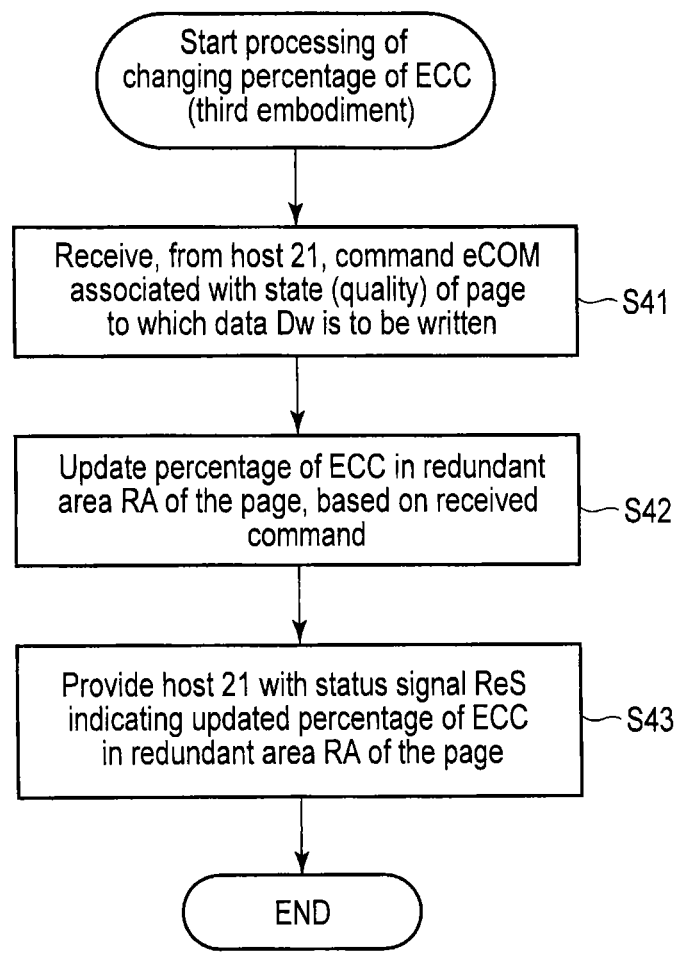
FIG. 19 is a flowchart showing processing of changing the percentage of the length of an ECC according to a third embodiment.
Figure 20:
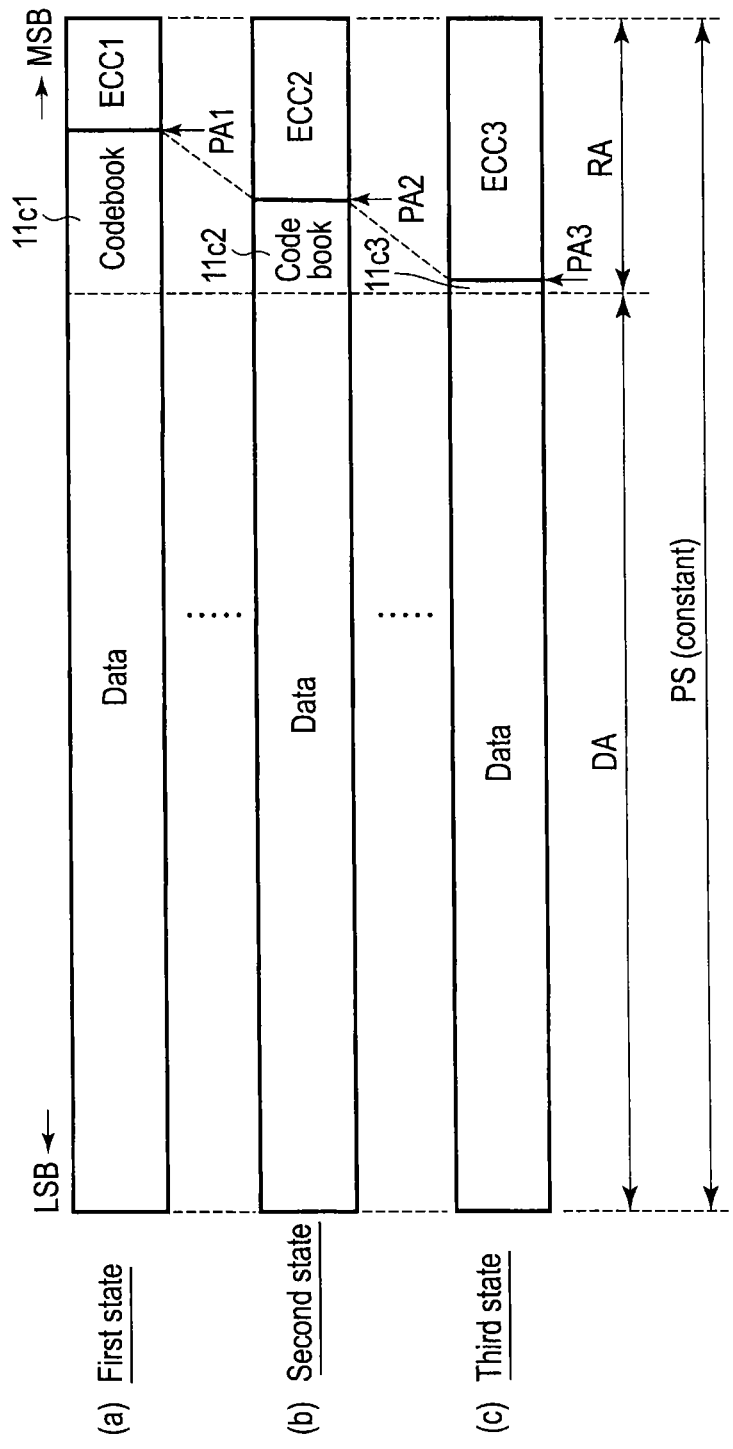
FIG. 20 is a view showing an example of a page structure according to the third embodiment.

Referring then to FIGS. 19 and 20, a third embodiment will be described. The third embodiment relates to an example where the ratio between the lengths of the ECC and the codebook is changed in response to a request from the host 21. In the third embodiment, elements similar to those of the second embodiment will not be described.

[Configuration]

Since the third embodiment is substantially the same in configuration as the second embodiment, no detailed description will be given of the configuration.

[Operation]

[Processing of Changing Percentage of Length of ECC]

Referring now to FIG. 19, a description will be given of processing of changing the percentage of the length of the ECC, according to the third embodiment.

In step S41, the controller 10 receives, from the host 21, an extensive command eCOM associated with the state (quality) of a page to which the write data Dw is written. The "extensive command eCOM" means a signal that is transmitted intentionally in order to request the memory system 31 of various states (for example, the state of data) at least, and that differs in definition from, for example, the above-mentioned read command. Specifically, upon receiving the command eCOM from the host 21, the control module 15 of the controller 10 analyzes the received command eCOM.

In step S42, the controller 10 changes the percentage of the length of the ECC in the redundant area RA of the page, based on the received command eCOM. Specifically, the control module 15 of the controller 10 changes the percentage of the length of an ECC in a redundant area RA in a page of an address corresponding to an address recited in the command eCOM in a manner similar to the above-described manner, based on the analyzed command eCOM. Further, the control module 15 of the controller 10 changes, in the same way as the above, the percentage of the length of the codebook 11c in the redundant area RA of the page in accordance with the change of the percentage of the length of the ECC.

For example, in accordance with the command eCOM from the host 21, the controller 10 changes the ratio between the lengths of the ECC and the codebook 11c in the redundant area RA so that the page structure is shifted from a first state (a) to a third state (c) as shown in FIG. 20.

More specifically, if the write data Dw is, for example, user data UD, the host 21 requests the controller 10 to set the page structure to the first state (a) in FIG. 20. The user data UD is allowed to have a short life since it is rewritten in a short period. However, for the user data UD, it is necessary to avoid program disturbance. Therefore, the host 21 requests the controller 10 to reduce the ratio of the length of ECC1 to that of codebook 11c1 as shown in the first state (a) of FIG. 20.

Moreover, in the case of, for example, management data CD, the host 21 requests the controller 10 to set the page structure to the third state (c) in FIG. 20. The management data CD is required to have a long life because it is not rewritten in a short period. However, for the management data CD, there is little necessity of preventing program disturbance. Therefore, the host 21 requests the controller 10 to increase the ratio of the length of ECC3 to that of codebook 11c3 as shown in the third state (c) of FIG. 20.

Returning to FIG. 19, the controller 10 provides, in step S43, the host 21 with a status signal ReS that indicates the percentage of the length of the ECC in the redundant area RA of the page after the change. More specifically, the control module 15 of the controller 10 provides the host 21 with a status signal ReS that indicates the ratio between the lengths of the ECC and the codebook 11c in the redundant area RA of the page after the change, thereby finishing the operation. In addition, the host 21 can detect the ratio between the lengths of the ECC and the codebook 11c in the redundant area RA of the page after the change, by analyzing the status signal ReS transmitted from the controller 10.

The other operations in the third embodiment are substantially the same as those of the second embodiment, and will not be described in detail.

The above-mentioned extensive command eCOM and extensive status signal ReS are not limited in the order and/or content of transmission to those of the second embodiment. For instance, firstly, a predetermined extensive signal may be transmitted from the controller 10 to the host 21, and then a predetermined extensive signal may be transmitted from the host 21 to the controller 10.

[Advantages]

The above-described configuration and operation of the third embodiment provide the same advantages as those of the first and second embodiments, and further provide the following advantage (2) at least: (2) In accordance with a request, quality higher than necessary is reduced to thereby appropriately control the life of the memory device.

The controller 10 receives, from the host 21, the extensive command eCOM associated with the state (quality) of a page to which the write data Dw is to be written (S41 of FIG. 19). The controller 10 changes the ratio between the lengths of the ECC and the codebook 11c in the redundant area RA of the page, based on the received command eCOM (S42 of FIG. 19).

Specifically, the control module 15 of the controller 10 changes, in the same way as the above, the percentage of the length of the ECC in the redundant area RA of a page corresponding to an address recited in the command eCOM, based on the analyzed command eCOM. Moreover, the control module 15 of the controller 10 changes, in the same way as the above, the percentage of the length of the codebook 11c in the redundant area RA of the page in accordance with the change of the percentage of the length of the ECC. For example, as is shown in FIG. 20, the controller 10 changes the ratio between the lengths of the ECC and the codebook 11c in the redundant area RA in accordance with the command eCOM from the host 21, so that the page structure will shift from the first state (a) to the third state (c).

Thus, in the third embodiment, quality higher than necessary can be reduced in accordance with a command from the host 21 to thereby appropriately control the life of the memory device. In other words, in the third embodiment, the ratio between the lengths of the ECC and the codebook 11c can be changed in accordance with a requested quality. Therefore, if high reliability is not required for data, or if the memory device is not required to have a long life, the ratio of the length of the ECC to that of the codebook 11c is reduced to suppress wastage of the data, as in the first state (a) shown in FIG. 20. In contrast, if high reliability is required or the memory device is required to have a long life, the ratio of the length of the ECC to that of the codebook 11c is increased as in the second or third state (b) or (c) shown in FIG. 20.

Although in the third embodiment, the controller 10 changes the ratio between the lengths of the ECC and the codebook 11c in accordance with the extensive command eCOM from the host 21, the embodiment is not limited to this. Namely, the subject that requests the change is not limited to the host 21. For instance, the controller 10 itself may change the ratio based on the type of the received write data Dw.

(Modification 1)

The above-described first to third embodiments are not limited them and may be modified when necessary.

For instance, the controller 10 may further comprise an ECC shifter 13 as shown in FIG. 21. The addition of the ECC shifter 13 enables the ECC and the codebook 11c to be shifted in a page as shown in FIG. 10, in addition to the change of the ratio between the lengths of the ECC and the codebook 11c. This is advantageous in further increasing the life of the memory device.

The controller 10 may also comprise a random-number generation circuit 13a as shown in FIG. 21. The random-number generation circuit 13a transmits a random number RN, generated at random, to the ECC shifter 13. The ECC shifter 13 moves the ECC and the codebook 11c based on the input random number RN. Thus, the ECC and the codebook 11c can be shifted, when necessary, not only based on, for example, the write count, but also based on the random number RN.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A controller of a nonvolatile memory configured to store n-level (n is a natural number not less than three) data page by page, the controller comprising:
    an extraction unit configured to extract, from a first data sequence with a first data length shorter than a data length of a page, a second data sequence with a data length shorter than the first data sequence;
    a conversion unit configured to convert the second data sequence into a third data sequence which is longer than the second data sequence and includes a second level difference smaller than a first level difference, when a difference between threshold voltages corresponding to two adjacent data included in the second data sequence is the first level difference;
    a control unit configured to control a percentage of a length of an error correction code added to the third data sequence; and
    an error correction encoder configured to generate the error correction code under control of the control unit.

2. The controller of claim 1, wherein
    the conversion unit generates conversion data for converting the second data sequence into the third data sequence; and
    the control unit controls a percentage of a length of the conversion data added to the third data sequence.

3. The controller of claim 2, wherein the control unit controls a ratio between the lengths of the error correction code and the conversion data added to the third data sequence, based on an access count of the nonvolatile memory.

4. The controller of claim 3, wherein the access count includes one of a count of writes to the page, a count of reads from the page, and a count of erases.

5. The controller of claim 2, wherein the control unit controls a ratio between the lengths of the error correction code and the conversion data in a redundant area in the page, the redundant area being other than an area where the third data sequence is arranged.

6. The controller of claim 2, wherein the control unit controls a ratio between the lengths of the error correction code and the conversion data, based on an external command.

7. The controller of claim 1, further comprising a table which shows access counts of the nonvolatile memory and the added error correction code in association with one another.

8. The controller of claim 7, wherein the control unit refers to the table, and changes the ratio between the lengths of the error correction code and the conversion data added to the page, when a fed-back access count exceeds a threshold for the access count shown in the table.

9. The controller of claim 1, further comprising a shifter configured to shift, in the page, an area where the error correction code is added, under control of the control unit.

10. A method of controlling a nonvolatile memory configured to store n-level (n is a natural number not less than three) data page by page, the method comprising:
    extracting, from a first data sequence with a first data length shorter than a data length of a page, a second data sequence with a data length shorter than the first data sequence;
    converting the second data sequence into a third data sequence which is longer than the second data sequence and includes a second level difference smaller than a first level difference, when a difference between threshold voltages corresponding to two adjacent data included in the second data sequence is the first level difference;
    controlling a percentage of a length of an error correction code added to the third data sequence; and
    generating the error correction code based on the controlling.

11. The method of claim 10, further comprising:
    generating conversion data for converting the second data sequence into the third data sequence; and
    controlling a percentage of a length of the conversion data added to the third data sequence.

12. The method of claim 11, further comprising controlling a ratio between the lengths of the error correction code and the conversion data added to the third data sequence, based on an access count of the nonvolatile memory.

13. The method of claim 12, wherein the access count includes one of a count of writes to the page, a count of reads from the page, and a count of erases.

14. The method of claim 11, further comprising:
    referring to a table which shows access counts of the nonvolatile memory and the added error correction code in association with one another; and
    changing the ratio between the lengths of the error correction code and the conversion data added to the page, when a fed-back access count exceeds a threshold for the access count shown in the table.

15. The method of claim 11, further comprising controlling a ratio between the lengths of the error correction code and the conversion data in a redundant area in the page, the redundant area being other than an area where the third data sequence is arranged.

16. The method of claim 11, further comprising controlling a ratio between the lengths of the error correction code and the conversion data, based on an external command.

17. The method of claim 10, further comprising shifting, in the page, an area where the error correction code is added.

18. A controller for storing data in a nonvolatile memory page by page, the controller being configured to
    extract, from a first data sequence shorter than a data length of a page, a second data sequence shorter than the first data sequence;
    refer to a difference between threshold voltages corresponding to two data included in the second data sequence, and convert the second data sequence into a third data sequence longer than the second data sequence; and
    control a percentage of a length of an error correction code added to the third data sequence.

19. The controller of claim 18, further configured to generate conversion data for converting the second data sequence into the third data sequence; and control a percentage of a length of the conversion data added to the third data sequence.

20. The controller of claim 19, further configured to control a ratio between the lengths of the error correction code and the conversion data added to the third data sequence, based on an access count of the nonvolatile memory.

* * * * *